United States Patent
Miyamoto

(10) Patent No.: US 8,637,979 B2
(45) Date of Patent: Jan. 28, 2014

(54) SEMICONDUCTOR DEVICE

(75) Inventor: Noboru Miyamoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 219 days.

(21) Appl. No.: 13/113,380

(22) Filed: May 23, 2011

(65) Prior Publication Data

US 2011/0304039 A1 Dec. 15, 2011

(30) Foreign Application Priority Data

Jun. 15, 2010 (JP) ................................. 2010-136115

(51) Int. Cl.
*H01L 23/34* (2006.01)

(52) U.S. Cl.
USPC ........... 257/712; 257/784; 257/787; 257/788; 257/E23.08; 438/122; 438/125

(58) Field of Classification Search
USPC .................... 257/712, 784, 787, 788, E23.08; 438/122, 125
See application file for complete search history.

(56) References Cited

U.S. PATENT DOCUMENTS

| | | | | |
|---|---|---|---|---|
| 6,621,701 | B2 * | 9/2003 | Tamba et al. | 361/699 |
| 6,940,712 | B2 * | 9/2005 | Chu et al. | 361/679.47 |
| 2001/0017763 | A1 | 8/2001 | Kaufmann | |
| 2002/0047132 | A1 * | 4/2002 | Fukada et al. | 257/114 |
| 2002/0109211 | A1 | 8/2002 | Shinohara | |
| 2008/0258316 | A1 * | 10/2008 | Tamba et al. | 257/784 |

FOREIGN PATENT DOCUMENTS

| | | |
|---|---|---|
| DE | 10 2009 045 063 A1 | 3/2011 |
| JP | 4-24952 | 1/1992 |
| JP | 4-199853 | 7/1992 |
| JP | 9-172126 A | 6/1997 |
| JP | 10-93015 A | 4/1998 |
| JP | 10-261744 | 9/1998 |
| JP | 2002-110867 | 4/2002 |
| JP | 2005-235992 | 9/2005 |
| JP | 2007-184315 | 7/2007 |
| JP | 2009-21530 | 1/2009 |

OTHER PUBLICATIONS

German Office Action Issued Oct. 1, 2012 in Patent Application No. 10 2011 077 543.9 (with English translation).
U.S. Appl. No. 13/455,577, filed Apr. 25, 2012, Miyamoto, et al.
U.S. Appl. No. 13/027,648, filed Feb. 15, 2011, Miyamoto, et al.
Japanese Office Action issued Oct. 16, 2012, in Japan Patent Application No. 2010-136115 (with English translation).
Office Action issued Mar. 26, 2013, in Japanese Patent Application No. 2010-136115 with English translation.

* cited by examiner

*Primary Examiner* — Thinh T Nguyen
(74) *Attorney, Agent, or Firm* — Oblon, Spivak, McClelland, Maier & Neustadt, L.L.P.

(57) ABSTRACT

A semiconductor device includes a semiconductor chip having a first main surface and a second main surface; a stacked structure on which the semiconductor chip is disposed; and a cooling body on which the stacked structure is disposed. The stacked structure includes a first thermal conductor fixed to the cooling body, an insulator disposed on the first thermal conductor, and a second thermal conductor disposed on the insulator and having the semiconductor chip disposed thereon. The first main surface of the semiconductor chip opposite to the second main surface in contact with the stacked structure is sealed with an insulation material. At least a part of the first thermal conductor protrudes outwardly of the insulation material in plan view.

6 Claims, 3 Drawing Sheets

SEMICONDUCTOR DEVICE

BACKGROUND OF THE INVENTION

1. Field of the Invention

The present invention relates to a semiconductor device, and particularly to a semiconductor device having a resin-encapsulation type power semiconductor element.

2. Description of the Background Art

Power semiconductor devices such as an IGBT (Insulated Gate Bipolar Transistor), a diode, a GTO (Gate Turn-Off Thyristor), and a transistor are used under a high voltage of more than several hundreds volts. Therefore, it is necessary to maintain the insulation performance within these semiconductor devices. Thus, most of the semiconductor devices are configured such that each semiconductor element is sealed with an insulating resin.

Furthermore, since the above-described semiconductor device generally generates considerable heat, it is often equipped with a heat dissipation device such as a heat dissipation fin and a heat sink for cooling the element generating heat.

For example, Japanese Patent Laying-Open No. 2002-110867 discloses a semiconductor device in which a semiconductor element covered by a mold resin sealing body is heated and pressure-bonded onto the insulating layer printed on the surface on which a heat dissipation fin is mounted. The semiconductor element in this semiconductor device is configured such that the end of the insulating layer in plan view is located outwardly of the end of the lead frame in plan view, that is, the insulating layer is greater than the lead frame in plan view. Consequently, the insulation performance of the insulating layer is maintained.

Furthermore, for example, Japanese Patent Laying-Open No. 2005-235992 discloses a semiconductor device having a configuration in which a semiconductor module is attached to a heat sink with a screw. In the semiconductor device disclosed in this document, for the purpose of fixing the semiconductor module on the heat sink, a rebound leaf spring and a reinforcing beam are disposed on the semiconductor module, through which a screw is passed for fixation of these components. The rebound leaf spring has a slit formed therein to enhance the flexibility by which the rebound leaf spring is deformed in the direction in which the screw is tightened. This allows suppression of stress concentration resulting from the tightening force of the screw, unevenness of the tightening force, and damage to the rebound leaf spring.

For example, as disclosed in Japanese Patent Laying-Open No. 2002-110867, the semiconductor element that is conventionally used is generally fixed with a screw onto the heat dissipation plate adhered onto the heat dissipation fin using silicone grease. Silicone grease is applied in order to stably fix the heat dissipation plate onto the heat dissipation fin. However, silicone grease is inferior in thermal conductivity, for example, as compared with metal material. For this reason, use of silicone grease may cause deterioration of the thermal conductivity between the heat dissipation plate and the heat dissipation fin. Consequently, the heat dissipation performance of the semiconductor element disposed on the silicone grease may deteriorate.

Furthermore, in the semiconductor device disclosed in Japanese Patent Laying-Open No. 2005-235992, the heat dissipation performance is improved by improving the tightening state in the case where a semiconductor module and a heat sink are fixed using a screw. However, the above-mentioned document fails to disclose the improvement of the insulation performance between the semiconductor module and the heat sink.

Furthermore, Japanese Patent Laying-Open No. 2005-235992 discloses the state of the bottom of the semiconductor module but fails to disclose the state within the semiconductor module. If the module including a semiconductor element is entirely covered with resin, this resin may decrease the efficiency of dissipating the heat of the semiconductor element.

The present invention has been made in light of the above-described problems. An object of the present invention is to provide a semiconductor device capable of improving the cooling performance for the semiconductor element while ensuring the insulation performance between the semiconductor element and the component attached to the outside of the semiconductor element.

SUMMARY OF THE INVENTION

The semiconductor device according to the present invention includes a semiconductor chip having a first main surface and a second main surface; a stacked structure on which the semiconductor chip is disposed; and a cooling body on which the stacked structure is disposed. The stacked structure includes a first thermal conductor fixed to the cooling body; an insulator disposed on the first thermal conductor; and a second thermal conductor disposed on the insulator. The semiconductor chip is disposed on the second thermal conductor. The first main surface of the semiconductor chip opposite to the second main surface in contact with the stacked structure is sealed with an insulation material. At least a part of the first thermal conductor protrudes outwardly of the insulation material in plan view.

In the semiconductor device according to the present invention, the heat generated by the semiconductor chip during its operation is transmitted through the first and second thermal conductors to the cooling body with high efficiency. Furthermore, at least a part of the first thermal conductor extends beyond the insulation material covering the second main surface of the semiconductor chip but is not sealed with the insulation material. This part of the first thermal conductor that is not sealed with the insulation material allows the heat to be transmitted from the first thermal conductor to the cooling body or to the outside air with high efficiency. Thus, the semiconductor device which is excellent in dissipation of the heat generated by the semiconductor chip is provided.

Furthermore, in the semiconductor device according to the present invention, an insulator is disposed between the first thermal conductor and the second thermal conductor, and at least one of the first and second main surfaces of the semiconductor chip is sealed with an insulation material. This allows reduction of the possibility that the current flowing through the circuit incorporated into the semiconductor chip leaks to the outside such as to a unit for fixing the semiconductor device. In other words, the semiconductor device allows the insulation performance to the outside to be ensured. Thus, the semiconductor device according to the present invention allows improvement in the cooling performance for the semiconductor chip by heat dissipation while ensuring the insulation performance to the outside.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments according to the present invention will be hereinafter described with reference to the drawings.

First Embodiment

Figure 1:
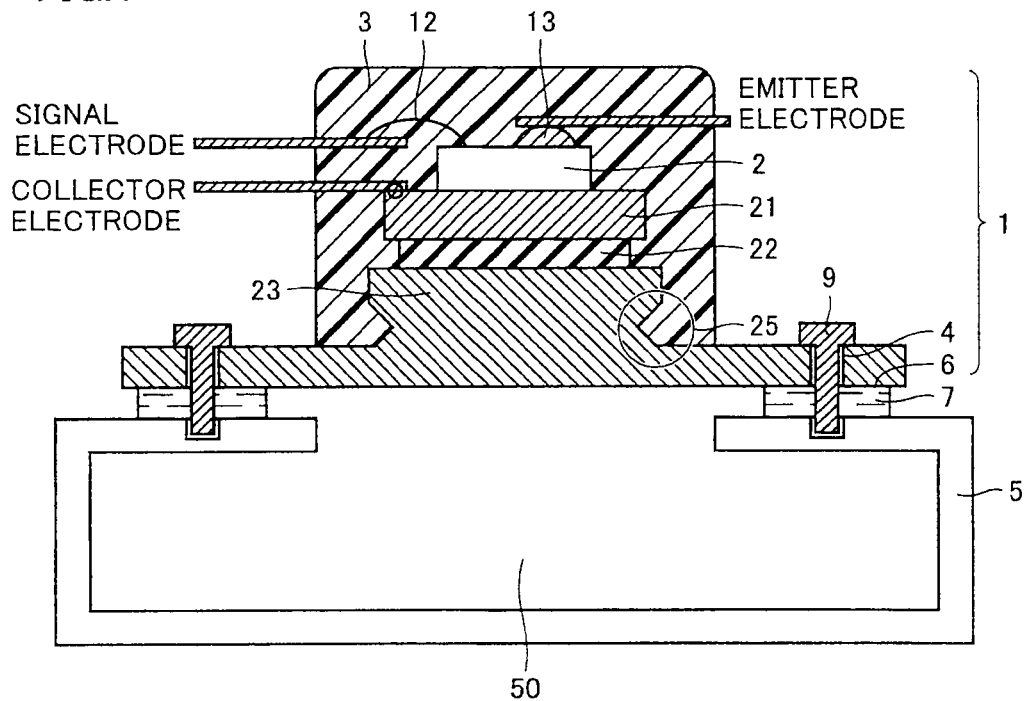
FIG. 1 is a schematic cross sectional view of the configuration of a semiconductor device according to the first embodiment of the present invention.

Referring to FIG. 1, the semiconductor device according to the present embodiment includes a device component part 1 and a cooling body component part 5 (cooling body). Device component part 1 includes a semiconductor chip 2, a thermal conductor 21 (second thermal conductor), an insulator 22, a fixing thermal conductor 23 (first thermal conductor), and a mold 3 (insulation material). These components are stacked in the order of fixing thermal conductor 23, insulator 22, thermal conductor 21, and semiconductor chip 2.

Semiconductor chip 2 is formed of a substrate made of a semiconductor material such as silicon, for example. Semiconductor chip 2 has a first main surface on which a number of power semiconductor devices (semiconductor elements) such as an IGBT, a diode, a GTO, and a transistor are formed. Thermal conductor 21 is a component having high thermal conductivity and made of copper or aluminum, for example, and serves to connect semiconductor chip 2 and insulator 22. Insulator 22 is formed of an epoxy resin, for example. Fixing thermal conductor 23 is a component for fixing device component part 1 and cooling body component part 5 to each other. As with thermal conductor 21, fixing thermal conductor 23 is a component having high thermal conductivity and, for example, made of copper, aluminum, or the like.

Accordingly, insulator 22 is disposed such that it is sandwiched between thermal conductor 21 and fixing thermal conductor 23. This allows the heat within insulator 22 to be immediately propagated toward thermal conductor 21 and fixing thermal conductor 23. Furthermore, fixing thermal conductor 23 is connected to a cooling body component part 5.

Accordingly, for example, the heat generated by the operation of the semiconductor element of semiconductor chip 2 is first transmitted to thermal conductor 21, and further transmitted through fixing thermal conductor 23 to cooling body component part 5, and then cooled by cooling body component part 5. In this way, device component part 1 including semiconductor chip 2 is entirely cooled. Therefore, even if semiconductor chip 2 generates heat during its operation, the heat is cooled by cooling body component part 5. In other words, thermal conductor 21 and fixing thermal conductor 23 each serve as a cooling body for semiconductor chip 2 which efficiently propagates the heat generated by semiconductor chip 2 toward cooling body component part 5.

It is preferable that cooling body component part 5 has a structure made of a material having high thermal conductivity such as copper or aluminum, for example. It is also preferable that cooling body component part 5 has a configuration in which, for example, the cooling water flows through a cooling body inner portion 50 to thereby cool the heat which is transmitted from semiconductor chip 2 through thermal conductor 21, insulator 22 and fixing thermal conductor 23 to cooling body component part 5.

Device component part 1 and cooling body component part 5 are fixed with a bolt 9 (fixing member). Specifically, fixing thermal conductor 23 and cooling body component part 5 are fixed with bolt 9. It is preferable that thermal conductor 21 and insulator 22 each are in the shape of an approximately flat plate while fixing thermal conductor 23 has a structure in which the lower portion is greater in area than the upper portion in plan view, as will be described later.

Fixing thermal conductor 23 is fixed at its lower portion to cooling body component part 5 with bolt 9. Therefore, fixing thermal conductor 23 is provided at its lower portion with a through hole 4 through which bolt 9 is passed.

Furthermore, for example, a liquid gasket 7 is applied between the underside surface of fixing thermal conductor 23, that is, a joining surface 6 facing cooling body component part 5 and the top surface of cooling body component part 5 facing joining surface 6. This liquid gasket 7 allows the airtightness to be maintained between device component part 1 (fixing thermal conductor 23) and cooling body component part 5. In addition, in order to maintain the airtightness between joining surface 6 and the top surface of cooling body component part 5, for example, an O-ring made of rubber may be used in place of liquid gasket 7.

Figure 2:
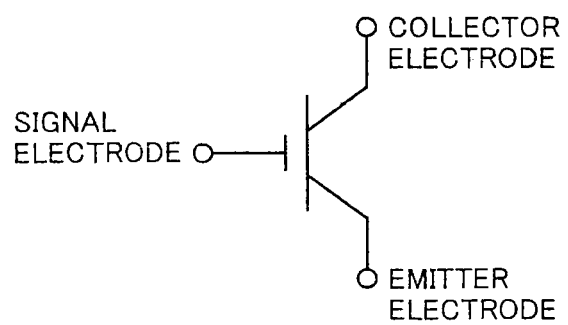
FIG. 2 is a circuit diagram of an electrode connected to the semiconductor chip in FIG. 1.

In order to electrically connect the semiconductor element formed on the first main surface of semiconductor chip 2 to the circuit external to the semiconductor device, a signal electrode, a collector electrode and an emitter electrode are connected. Referring to FIG. 2, the signal electrode is equivalent to a base electrode of a bipolar transistor, and the collector electrode and the emitter electrode are equivalent to a collector electrode and an emitter electrode, respectively, of the bipolar transistor.

Each of the above-mentioned electrodes and the semiconductor element of semiconductor chip 2 may be electrically connected to each other by ultrasonic bonding using a bonding wire 12 which is, for example, made of gold, aluminum, copper, or the like. Alternatively, these may also be electrically connected by a solder 13, for example.

The upper region of each of semiconductor chip 2, thermal conductor 21, insulator 22, and fixing thermal conductor 23 in device component part 1 is covered with mold 3. Mold 3 made of resin materials such as epoxy resin or urethane resin is formed so as to electrically insulate each component of device component part 1 including semiconductor chip 2 from, for example, cooling body component part 5 disposed outside of device component part 1.

However, mold 3 does not cover the lower portion of fixing thermal conductor 23, particularly the region having through hole 4 formed therein and located in proximity to the section connected to cooling body component part 5 with bolt 9 (the ends on the right and left sides in the cross sectional view of FIG. 1). In this region, the top surface (the surface on the opposite side of joining surface 6) and joining surface 6 are both exposed. Furthermore, a part of joining surface 6 is fixed by liquid gasket 7 to the main body of cooling body component part 5.

Then, the shape of fixing thermal conductor 23 will be described. The area of the upper portion of fixing thermal conductor 23 (the side facing insulator 22) in plan view is approximately equal to the area of insulator 22 or thermal conductor 21 in plan view. In contrast, the area of the lower portion of fixing thermal conductor 23 (the side facing cooling body component part 5) in plan view is greater than the area of the upper portion thereof in plan view. Accordingly, mold 3 covers the upper portion of each of semiconductor chip 2, thermal conductor 21, insulator 22, and fixing thermal conductor 23, but does not cover the lower portion of fixing thermal conductor 23.

In other words, since the lower portion of fixing thermal conductor 23 is greater in area than the upper portion of fixing thermal conductor 23 in plan view, it protrudes outwardly of the outer periphery of mold 3 in plan view. Therefore, at least a part of the face (top surface) of the lower portion of fixing thermal conductor 23 which extends in the direction along the first and second main surfaces of semiconductor chip 2 is exposed to the outside air. In addition, the other main surface (joining surface 6) on the opposite side of the above-mentioned part faces cooling body component part 5 or is in contact with liquid gasket 7. In other words, fixing thermal conductor 23 is provided at its lower portion with a region in which the top surface and joining surface 6 are not covered with mold 3 and extend outwardly of mold 3.

It is also preferable that a wedge-shaped region 25 is formed in a part of the surface in the region where the upper portion and the lower portion of fixing thermal conductor 23 are connected. Wedge-shaped region 25 means a region configured in such a manner that a notch is formed in the cross section (that a recess is formed in the cross section) so as to reduce the area in plan view.

Mold 3 is formed so as to cover wedge-shaped region 25. Accordingly, it is preferable that mold 3 is formed so as to fill the recess in wedge-shaped region 25.

It is to be noted that the heat generated during the operation of semiconductor chip 2 is approximately 150° C. to 175° C. at the highest, which is sufficiently low as compared with the temperature at which solder 13 melts. This allows elimination of the possibility that the heat generated by semiconductor chip 2 causes damage to the connection of the emitter electrode and the like by solder 13.

Then, the operations and effects of the present embodiment will be described.

The semiconductor device according to the present embodiment is configured to have a region (lower portion) of fixing thermal conductor 23 in which both of the top surface and joining surface 6 are not covered with mold 3 but exposed. Accordingly, this region is in direct contact with the outside air, with the result that the efficiency of dissipating the heat from fixing thermal conductor 23 is improved in this region. Alternatively, there is also a region such as a part of joining surface 6, for example, that is in contact with liquid gasket 7 to thereby allow direct transmission of the heat to the main body of cooling body component part 5. Therefore, the efficiency of cooling the heat generated by semiconductor chip 2 can be enhanced, for example, as compared with the case where device component part 1 including fixing thermal conductor 23 is entirely covered with mold 3. Consequently, any damage and the like caused by overheating of semiconductor chip 2 can be suppressed.

Furthermore, in the semiconductor device according to the present embodiment, for example, when the heat generated during the operation of semiconductor chip 2 reaches fixing thermal conductor 23 through thermal conductor 21 and the like, the heat is then cooled by cooling body component part 5 facing the lower portion of fixing thermal conductor 23. The lower portion of fixing thermal conductor 23 is brought into contact, for example, with cold water flowing through cooling body inner portion 50, which leads to cooling of fixing thermal conductor 23. Therefore, since device component part 1 is entirely cooled with high efficiency, any damage and the like caused by overheating of semiconductor chip 2 can be suppressed.

Furthermore, in the present embodiment, device component part 1 and cooling body component part 5 are joined by bolt 9, but not by silicone grease for stably fixing both component parts. Accordingly, it becomes possible to suppress reduction in the efficiency of the heat dissipation which occurs, due to the applied silicone grease, in the heat dissipation path extending from semiconductor chip 2 to cooling body component part 5.

In contrast, in the semiconductor device according to the present embodiment, all of semiconductor chip 2, thermal conductor 21, insulator 22 and the like constituting device component part 1 excluding a part of fixing thermal conductor 23 are covered with an insulating resin material (mold 3). Furthermore, insulator 22 is sandwiched between thermal conductor 21 and fixing thermal conductor 23. Accordingly, it becomes possible to suppress occurrence of faults and failures that, for example, the current flowing through the circuit incorporated in semiconductor chip 2 leaks to the outside of the semiconductor device such as to the substrate and the like for fixing the semiconductor device, thereby exerting an influence on the operation of the external circuit and the like connected to the semiconductor element.

Thus, the semiconductor device according to the present embodiment is configured such that most of device component part 1 is covered with insulating mold 3 while a part of device component part 1 is not covered with mold 3 but is exposed to the outside air or directly cooled by cooling body component part 5. Furthermore, the semiconductor device according to the present embodiment is also configured such that semiconductor chip 2 is stacked on the stacked structure including two thermal conductors and an insulator sandwiched between these thermal conductors. As described above, the present semiconductor device has a configuration that allows improvement both in the insulation performance to the outside and the heat dissipation performance of the main body.

Furthermore, in the semiconductor device according to the present embodiment, wedge-shaped region 25 is formed in a part of the surface of fixing thermal conductor 23. In addition, mold 3 is formed so as to fill the recess in wedge-shaped region 25. Consequently, the adhesiveness of mold 3 to the surface of fixing thermal conductor 23 is improved, which leads to a further enhancement in the insulation performance between device component part 1 and cooling body component part 5.

Furthermore, in the present embodiment, liquid gasket 7 serves to keep the airtightness of cooling body inner portion 50 in the vicinity of bolt 9 and through hole 4 where device component part 1 and cooling body component part 5 are joined to each other. This allows suppression of reduction in the efficiency for cooling fixing thermal conductor 23 which results, for example, from leakage of cold water flowing through cooling body inner portion 50 and the incoming outside air into cooling body inner portion 50.

Second Embodiment

The present embodiment is different from the first embodiment in the manner that the device component part and the cooling body component part are joined. The semiconductor device according to the present embodiment will be hereinafter described.

Figure 3:
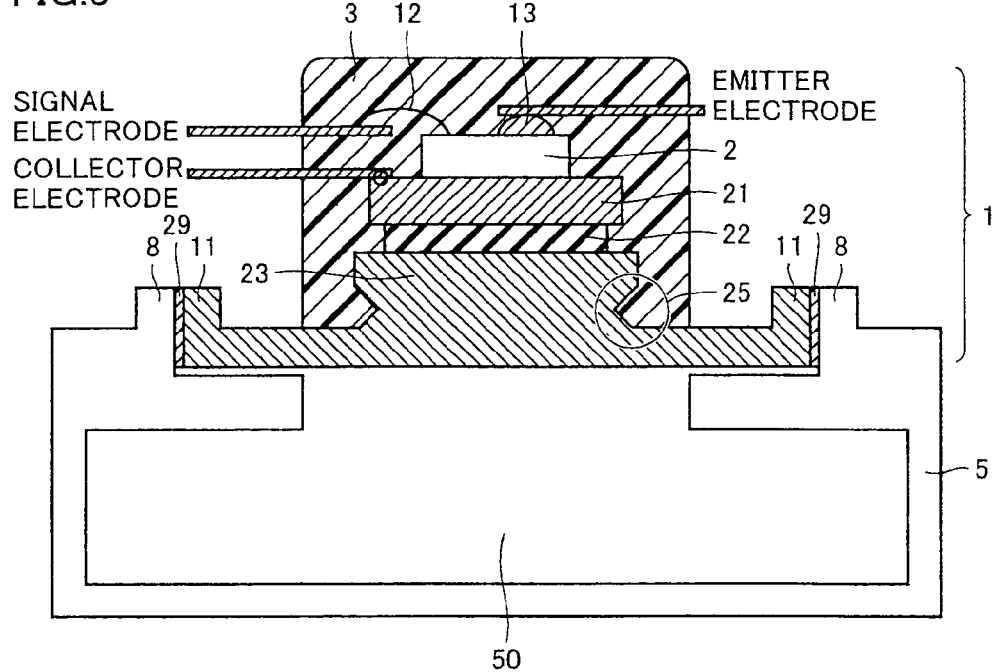
FIG. 3 is a schematic cross sectional view of the configuration of the semiconductor device according to one example of the second embodiment of the present invention.

Referring to FIG. 3, the semiconductor device according to the present embodiment is approximately identical in configuration to the semiconductor device according to the first embodiment. However, in the present embodiment, fixing thermal conductor 23 and cooling body component part 5 are welded in a joining portion 29 (a weld).

Fixing thermal conductor 23 and cooling body component part 5 each are provided with a protrusion extending in the vertical direction in FIG. 3 for welding of these components. Specifically, fixing thermal conductor 23 and cooling body component part 5 are provided with a thermal conductor protrusion 11 and a cooling body protrusion 8, respectively.

In addition, as in the first embodiment, fixing thermal conductor 23 is configured such that the upper portion is greater in area than the lower portion in plan view and the lower portion protrudes outwardly of mold 3 in the lateral direction. Furthermore, fixing thermal conductor 23 is configured to have the lowermost surface (the region corresponding to joining surface 6 in FIG. 1) in which a part thereof (the ends on the right and left sides in the cross sectional view in FIG. 1) faces (is joined to or in contact with) a part of the main body of cooling body component part 5 while another part thereof (the center section in the cross sectional view in FIG. 1) faces cooling body inner portion 50 and is brought into contact with cold water and the like flowing through cooling body inner portion 50. In other words, in FIG. 3, the lowermost surface of fixing thermal conductor 23 may be or may not be welded to cooling body component part 5.

Also in the present embodiment, the materials similar to those of the semiconductor device in the first embodiment are employed. In other words, the main body of each of cooling body component part 5 and fixing thermal conductor 23 is a structure made of copper or aluminum, for example. Accordingly, the main bodies of thermal conductor protrusion 11 and cooling body protrusion 8 are heated and directly joined through joining portion 29 to each other by welding.

In addition, the heat generated during the operation of semiconductor chip 2 is approximately 150° C. to 175° C. at the highest, which is sufficiently low as compared with the temperature at which the region welded at joining portion 29 melts. This allows elimination of the possibility that the heat generated by semiconductor chip 2 causes damage to the connection in joining portion 29.

Since the configuration of the present embodiment is almost the same as that of the first embodiment other than those described above, the same components as those in the first embodiment are designated by the same reference characters in FIG. 3, and description thereof will not be repeated.

The operations and effects of the present embodiment will then be described. In addition to each effect in the first embodiment, the present embodiment has the effects described below.

In the present embodiment, device component part 1 and cooling body component part 5 are joined by welding, in contrast to the configuration in which device component part 1 and cooling body component part 5 are fixed with bolt 9, for example, as in the first embodiment. This eliminates the need to use bolt 9 for fixing these components. Furthermore, in the present embodiment, bolt 9 is not used, which also eliminates the need to dispose liquid gasket 7 between fixing thermal conductor 23 and cooling body component part 5. Therefore, the number of components required for the configuration of the semiconductor device can be decreased, with the result that the cost for the device can be reduced.

Furthermore, in the present embodiment, when the lowermost surface of fixing thermal conductor 23 is joined to or brought into contact with a part of the main body of cooling body component part 5, the surface of cooling body component part 5 is cooled, which causes fixing thermal conductor 23 to be cooled. In addition, the region of fixing thermal conductors 23 facing cooling body inner portion 50 is cooled by cold water flowing through cooling body inner portion 50. This allows improvement in the effect for cooling the heat that reaches fixing thermal conductor 23 transmitted from semiconductor chip 2 through thermal conductor 21 and the like.

In the present embodiment, device component part 1 and cooling body component part 5 are welded through joining portion 29. Accordingly, the airtightness of cooling body inner portion 50 is maintained, which allows suppression of reduction in the efficiency of cooling fixing thermal conductor 23 that results, for example, from leakage of cold water flowing through cooling body inner portion 50 and incoming outside air into cooling body inner portion 50.

Figure 4:
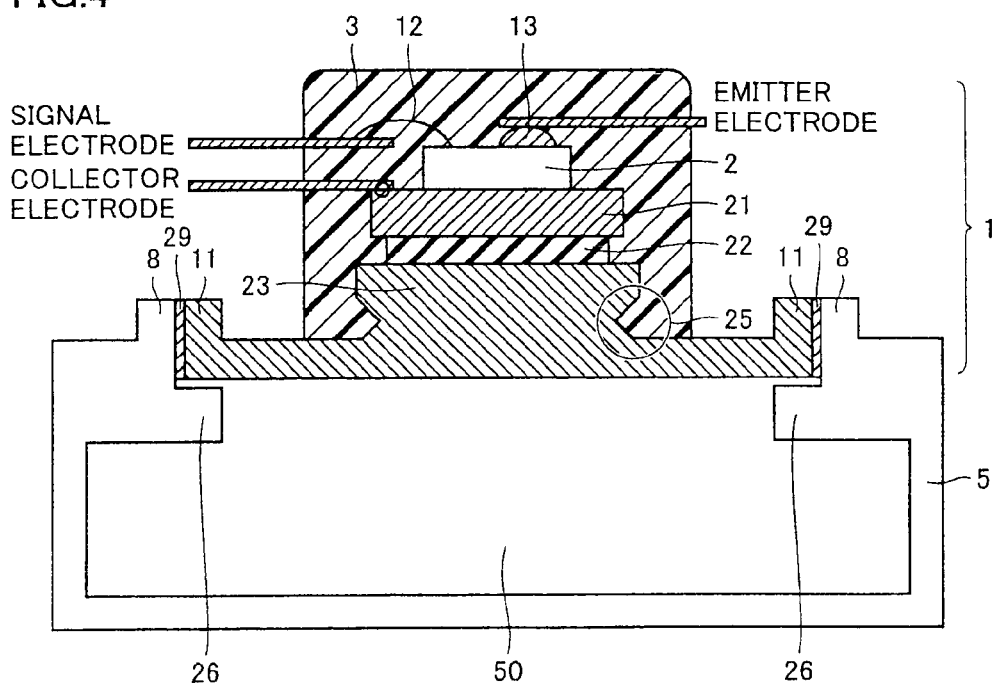
FIG. 4 is a schematic cross sectional view of the configuration of the semiconductor device according to another example different from that in FIG. 3, in the second embodiment of the present invention.

FIG. 4 shows a modification of the semiconductor device according to the present embodiment. In the semiconductor device in FIG. 4, fixing thermal conductor 23 is configured to have a lower face having an area which is relatively small in the region facing (joined to or in contact with) the main body of cooling body component part 5 and an area which is relatively large in the region facing cooling body inner portion 50, as compared with the semiconductor device in FIG. 3. Since other features are the same as those of the semiconductor device in FIG. 3, the same components as those in FIG. 3 are designated by the same reference characters in FIG. 4 and description thereof will not be repeated.

As in the semiconductor device in FIG. 4, a modification may be made such that the ratio of the area in the region of the lower face of fixing thermal conductor 23 facing (joined to or in contact with) the main body of cooling body component part 5 is decreased with respect to the semiconductor device in FIG. 3. Even in this modified configuration, fixing thermal conductor 23 can still be cooled with high efficiency by cold water in the main body of cooling body component part 5 and cooling body inner portion 50. Other operations and effects in the semiconductor device in FIG. 4 are the same as those of the semiconductor device in FIG. 3.

The second embodiment according to the present invention is different from the first embodiment of the present invention only in the features as set forth above. In other words, all of the configurations, conditions, procedures, effects and the like for the second embodiment of the present invention which are not set forth above conform to those of the first embodiment according to the present invention.

Third Embodiment

The present embodiment is different from the first embodiment in the configuration of fixing thermal conductor 23. The semiconductor device according to the present embodiment will be hereinafter described.

Figure 5:
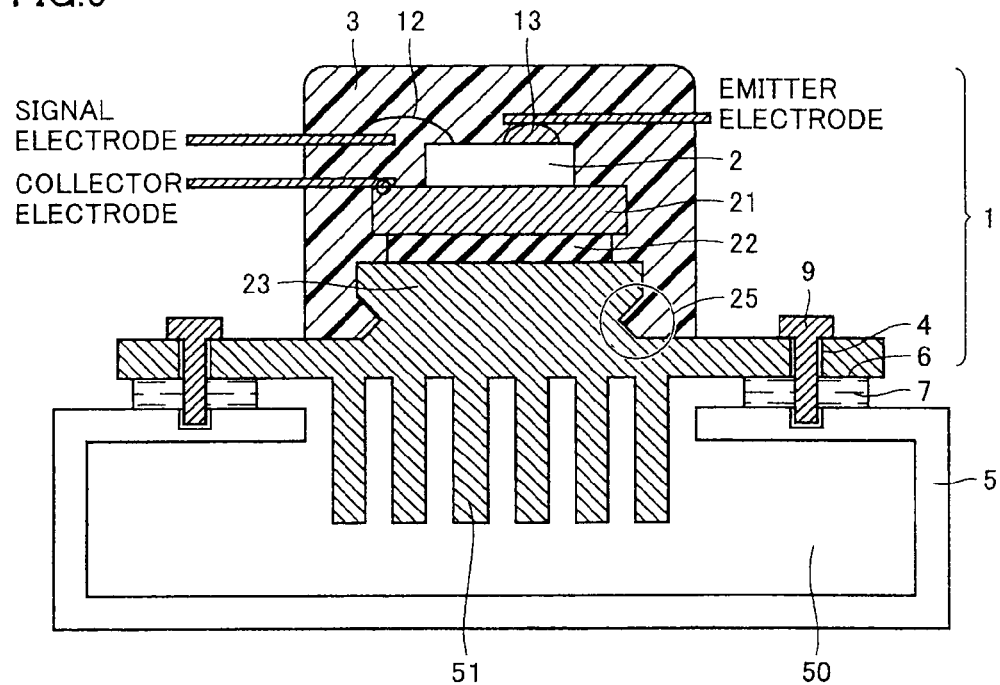
FIG. 5 is a schematic cross sectional view of the configuration of the semiconductor device according to one example of the third embodiment of the present invention.

Referring to FIG. 5, the semiconductor device according to the present embodiment has approximately the same configuration as that of the semiconductor device according to the first embodiment shown in FIG. 1. However, in the present embodiment, a comb-shaped portion 51 (protrusions) extending in the vertical direction in FIG. 5 is formed in the region of the lower face of fixing thermal conductor 23 which does not face the main body of cooling body component part 5 (the center section in the horizontal direction in the cross sectional view in FIG. 5).

Comb-shaped portion 51 extends so as to protrude in the downward direction in FIG. 5 from the position at the same height in the vertical direction as that of joining surface 6 corresponding to the lower face of fixing thermal conductor 23. Other configurations such as materials and the like forming fixing thermal conductor 23 are the same as those of the first embodiment. Accordingly, the same components as those in the first embodiment are designated by the same reference characters in FIG. 5 and description thereof will not be repeated.

Then, the operations and effects of the present embodiment will be described. In addition to each effect in the first embodiment, the present embodiment has the effects described below.

The present embodiment is different from other embodiments in that the lower face of fixing thermal conductor 23 is not plane but has comb-shaped portion 51 formed thereon. Accordingly, the surface area of the portion of fixing thermal conductor 23 facing cooling body inner portion 50 is greater than that of fixing thermal conductor 23 in other embodiments. Therefore, the area of the region that can cool (dissipate) the heat of fixing thermal conductor 23 is greater than that of fixing thermal conductor 23 in other embodiments. Consequently, in the present embodiment, the effects of dissipating the heat generated by semiconductor chip 2 are further improved.

Figure 6:
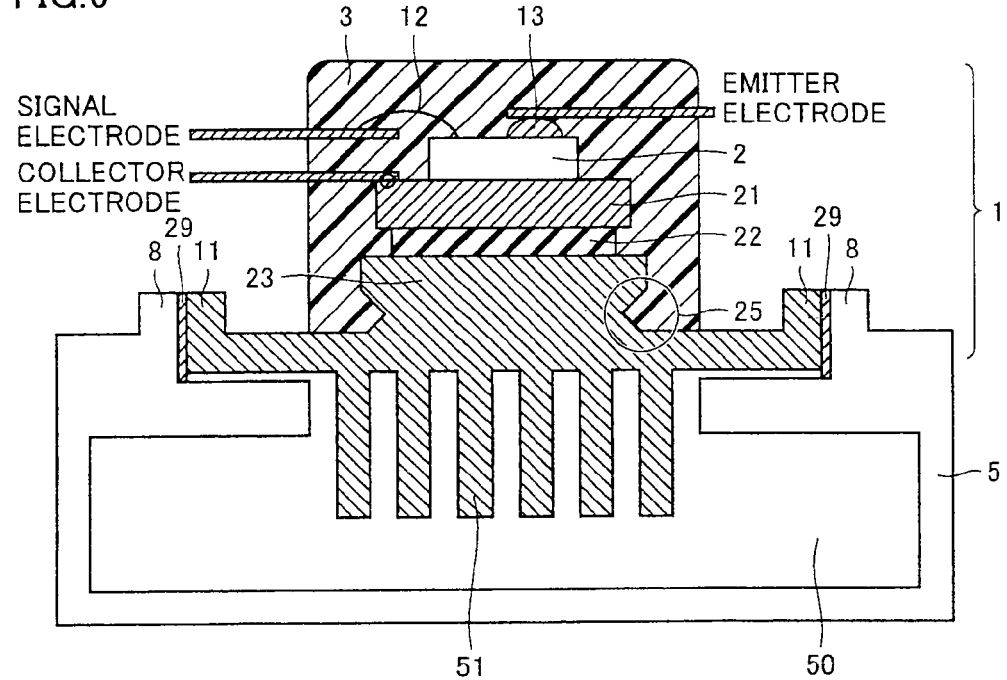
FIG. 6 is a schematic cross sectional view of the configuration of the semiconductor device according to another example different from that in FIG. 5, in the third embodiment of the present invention.

FIG. 6 shows a modification of the semiconductor device according to the present embodiment. The semiconductor device in FIG. 6 is different from the semiconductor device in FIG. 5 in that device component part 1 and cooling body component part 5 are joined by welding, for example, as in the semiconductor device (shown in FIG. 3) in the second embodiment. Since other features are the same as those of the semiconductor device in FIG. 5, the same components as those in FIG. 5 are designated by the same reference characters in FIG. 6 and description thereof will not be repeated.

In the semiconductor device according to the present embodiment having fixing thermal conductor 23 provided with comb-shaped portion 51, device component part 1 and cooling body component part 5 may be joined by bolt 9 as shown in FIG. 5 or may be joined by welding as in FIG. 6. In addition to the operations and effects of the semiconductor device in FIG. 5, the semiconductor device in FIG. 6 has the same operations and effects as those of the semiconductor device in the second embodiment shown in FIG. 3.

The third embodiment according to the present invention is different from the first embodiment according to the present invention only in the features set forth above. In other words, all of the configurations, conditions, procedures, effects and the like for the third embodiment of the present invention which are not set forth above conform to those of the first embodiment of the present invention.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a semiconductor chip;
   a cooling body;
   a stacked structure including:
      a first thermal conductor fixed to said cooling body,
      an insulator disposed on a surface of said first thermal conductor, and
      a second thermal conductor disposed on said insulator, a surface of said semiconductor chip being disposed on said second thermal conductor, wherein a portion of said first thermal conductor spaced from said surface of said first thermal conductor having said insulator disposed thereon is disposed on said cooling body; and
   an electrically insulating material covering said semiconductor chip and said stacked structure other than said portion of said first thermal conductor disposed on said cooling body, whereby said portion of said first thermal conductor disposed on said cooling body protrudes outwardly of said insulation material in plan view, and
   wherein a portion of said first thermal conductor located between said surface having said insulator disposed thereon and said portion disposed on said cooling body exhibits a recess being recessed inwardly into the first thermal conductor and opposite to the outward direction of extension of the portion of said first thermal conductor disposed on said cooling body.

2. The semiconductor device according to claim 1, wherein each of said first thermal conductor and said cooling body is provided with a fitting hole, and said first thermal conductor and said cooling body are connected to each other by a fixing member extending through said fitting hole.

3. The semiconductor device according to claim 2, wherein a gasket is disposed in a region where said first thermal conductor and said cooling body are connected to each other by said fixing member.

4. The semiconductor device according to claim 1, wherein said first thermal conductor and said cooling body are welded by a weld.

5. The semiconductor device according to claim 1, further comprising a protrusion formed in a part of a region of said first thermal conductor facing said cooling body.

6. The semiconductor device according to claim 1, wherein said surface of said first thermal conductor having said insulator disposed thereon has a dimension larger than that of said second thermal conductor, and wherein the recess being configured such that the dimension of the portion exhibiting the recess is smaller than that of said second thermal conductor, and wherein said electrically insulating material covers said portion having said recess.

* * * * *